United States Patent [19]
Hsu et al.

[11] Patent Number: 5,620,817
[45] Date of Patent: Apr. 15, 1997

[54] FABRICATION OF SELF-ALIGNED ATTENUATED RIM PHASE SHIFT MASK

[75] Inventors: Jung-Hsien Hsu; Chung-Kuang Lee; Chia S. Tsai, all of Hsin-Chu, Taiwan

[73] Assignee: Taiwan Semiconductor Manufacturing Company Ltd, Hsin-Chu, Taiwan

[21] Appl. No.: 558,492

[22] Filed: Nov. 16, 1995

[51] Int. Cl.$^6$ ........................................... G03F 9/00
[52] U.S. Cl. ........................... 430/5; 430/322; 430/324
[58] Field of Search ........................... 430/5, 322, 324, 430/394

[56] References Cited

U.S. PATENT DOCUMENTS

| | | | |
|---|---|---|---|
| 5,358,808 | 10/1994 | Nitayama et al. | 430/5 |
| 5,376,483 | 12/1994 | Rolfson | 430/5 |
| 5,387,485 | 2/1995 | Sukegawa et al. | 430/5 |
| 5,393,623 | 2/1995 | Kamon | 430/5 |
| 5,403,682 | 4/1995 | Lin | 430/5 |
| 5,429,897 | 7/1995 | Yoshioka et al. | 430/5 |
| 5,478,678 | 12/1995 | Yang et al. | 430/5 |
| 5,484,672 | 1/1996 | Bajuk et al. | 430/5 |

Primary Examiner—S. Rosasco
Attorney, Agent, or Firm—George O. Saile; Larry J. Prescott

[57] ABSTRACT

This invention provides a method of forming an attenuating phase shifting rim type photomask and an attenuating phase shifting rim type photomask for use in projection type lithographic apparatus. The photomask is formed by exposing a layer of negative photoresist through a second surface of a transparent mask substrate having a patterned layer of attenuating phase shifting material formed on a first surface of the transparent mask substrate. The exposed and developed photoresist forms a pedestal with sloping sides. A layer of opaque material is vertically anisotropically deposited on the top of the pedestal and that part of the patterned layer of attenuating phase shifting material not shaded by the pedestal. The pedestal and opaque material formed on the top of the pedestal is then removed to complete the mask.

18 Claims, 3 Drawing Sheets

FABRICATION OF SELF-ALIGNED ATTENUATED RIM PHASE SHIFT MASK

BACKGROUND OF THE INVENTION (1) Field of the Invention

The invention relates to the formation of a self-aligned attenuated rim phase shift mask using exposure of negative photoresist through the backside of a transparent substrate by ultraviolet flood light using a patterned layer of attenuating phase shifting material as a mask. A vertical anisotropic deposition of an opaque layer and a lift off process are used to complete the mask.

(2) Description of the Related Art

The use of phase shift technology in masks used in projection systems to expose a layer of photoresist formed on a semiconductor substrate has become very important as the requirements of image definition and depth of focus have become more stringent. A number of workers have disclosed methods of forming and using phase shifting photomasks.

U.S. Pat. No. 5,358,808 to Nitayama et al. and U.S. Pat. No. 5,376,483 to Rolfson teaches the use of photomasks having a number of phase shifting regions with different optical lengths and different amounts of phase shift.

U.S. Pat. No. 5,403,682 to Lin teaches the use of phase shifting rims surrounding each pattern of a photomask.

U.S. Pat. No. 5,429,897 to Yoshioka et al. teaches the use of attenuating type phase shifting masks.

U.S. Pat. No. 5,393,623 to Kamon teaches the use of reflection type phase shifting photomasks.

U.S. Pat. No. 5,387,485 to Sukegawa et al. teaches the use of photomasks using annular arrangement of light shielding regions together with phase shifting material.

The Invention of this Patent Application teaches the fabrication and use of an attenuating phase shifting rim type photomask. The photomask is formed using self alignment techniques which avoids tolerance build up due to alignment errors.

SUMMARY OF THE INVENTION

In the manufacture of integrated circuits decreasing dimensions and tolerances make the need for improved photomasks and photolithographic techniques critical. Photomasks using phase shifting techniques have been used in photolithographic projection systems to provide improved image quality and depth of focus tolerance.

Rim type phase shifting photomasks have been used to improve the image quality and depth of focus in photolithographic projection systems. In the fabrication of masks used in these systems the relative alignment between different elements of the mask is of critical importance. When self alignment can be achieved it can be used to help solve the problem of maintaining relative alignment between different elements of the photomask.

It is an object of this invention to provide a method of forming a rim type phase shifting photomask using attenuating or partially transmitting phase shifting material and self alignment techniques.

It is a further object of this invention to provide a rim type phase shifting photomask formed using self alignment techniques and attenuating or partially transmitting phase shifter material.

These objectives are achieved by forming a patterned layer of attenuating or partially transmitting phase shifting material on the first surface of a transparent mask substrate having a first surface and a second surface. A layer of negative photoresist is formed on the first surface of the transparent substrate covering the patterned layer of attenuating phase shifting material.

After the layer of negative photoresist has been formed the second surface of the transparent mask substrate is illuminated with light. The light passes through the transparent mask substrate and exposes the photoresist above those regions of the transparent mask substrate where there is no attenuating phase shifting material. The intensity of the light is such that the attenuating phase shifting material blocks the light from the regions of the photoresist above the patterned layer of attenuating phase shifting material and those regions of photoresist remain unexposed.

After the negative photoresist is developed pedestals of photoresist remain. An opaque material is then vertically anisotropically deposited on the top of the photoresist pedestals and the patterned layer of attenuating phase shifting material. The photoresist pedestals and the opaque material deposited on the photoresist pedestals is then removed using a lift off process and a rim type attenuating phase shifting photomask is formed. The rim of attenuating phase shifting material is self aligned to the rest of the mask.

The rim type attenuating phase shifting photomasks of this invention are used in a projection type photolithography process, such as a five times reduction stepper, to form an image on a layer of photoresist formed on a semiconductor substrate used for integrated circuit manufacture. The attenuated and phase shifted light passing through the attenuating phase shifting portions of the photomask interact with light which has been neither shifted in phase nor attenuated to form an interference pattern which improves the image definition and depth of focus of the image formed on the photoresist formed on the semiconductor substrate.

DESCRIPTION OF THE PREFERRED EMBODIMENTS

Figure 1:
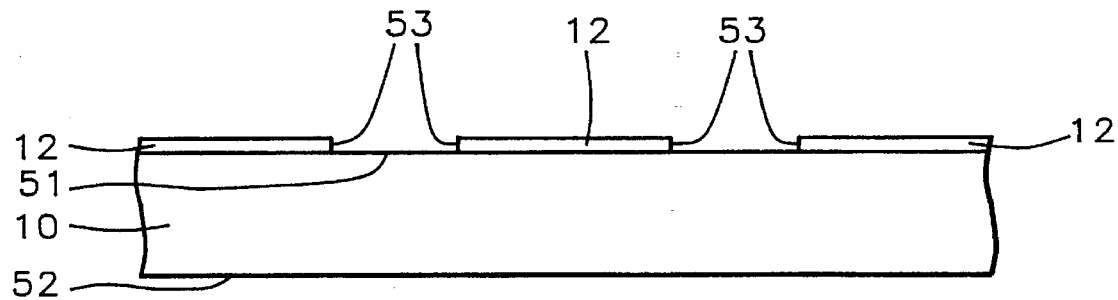
FIG. 1 shows a cross section view of a transparent mask substrate having a first surface and a second surface with a patterned layer of attenuating phase shifting material formed on the first surface of the transparent mask substrate.

Refer now to FIGS. 1–5, there is shown the principle embodiment for forming the rim type attenuating phase shifting photomask of this invention. As shown in FIG. 1 the mask is formed on a transparent substrate 10 having a first surface 51 and a second surface 52. The transparent substrate 10 is a material such as quartz having a thickness of between about 0.090 and 0.250 inches. A patterned layer of attenuating, or partially transmitting, phase shifting material 12 having pattern edges 53 is formed on the first surface 51 of the transparent substrate 10. The attenuating phase shifting material 12 is a material such as MoSiO having a thickness of between about 50 and 300 nanometers. The attenuating phase shifting material is deposited by means of sputtering and patterned using standard lithographic techniques.

Figure 2:
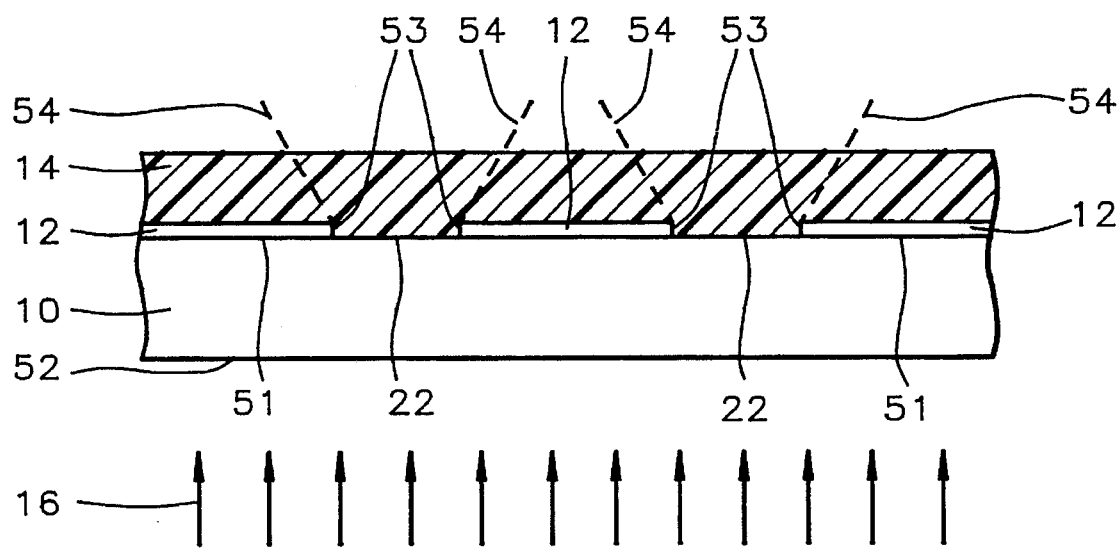
FIG. 2 shows a cross section view of a layer of negative photoresist formed on the first surface of the transparent mask substrate covering the patterned layer of attenuating phase shifting material with the second surface of the transparent mask substrate illuminated by an ultra violet flood light.

As shown in FIG. 2, a layer of negative photoresist 14 with a thickness of between about 0.5 and 3 micrometers is then formed on the first surface 51 of the transparent substrate 10 covering the patterned layer of attenuating phase shifting material 12. Light 16 from an ultra violet flood light, having a wavelength between about 150 and 300 nanometers, is then used to illuminate the second surface 52 of the transparent substrate 10. The light 16 passes through the transparent substrate 10 and exposes those regions of the negative photoresist 14 which are directly above the regions 22 of the transparent substrate 10 having no attenuating phase shifting material 12. The intensity and exposure time of the light are adjusted so that the attenuating phase shifting material 12 blocks the light 16 from exposing those regions of the negative photoresist 14 which are above the regions of attenuating phase shifting material 12. The light at the pattern edges 53 of the patterned layer of phase shifting material 12 diffuses so that the line 54 between the exposed and unexposed regions of negative photoresist is not perpendicular to the first surface 51 of the transparent substrate 10 but increasingly extends over the attenuating phase shifting material as the distance above the first surface 51 of the transparent substrate 10 increases.

Figure 3:
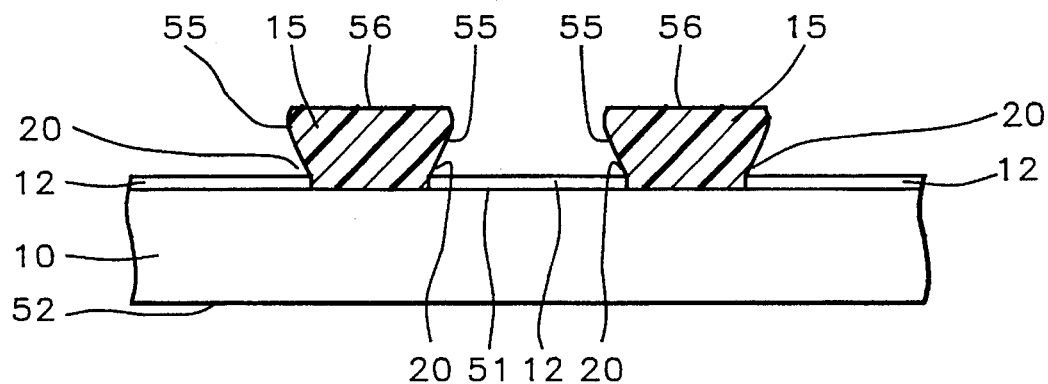
FIG. 3 shows a cross section view of the photomask after the negative photoresist has been developed forming the photoresist pedestals.

As shown in FIG. 3, the negative photoresist is then developed thereby removing the unexposed regions of negative photoresist and forming photoresist pedestals 15, each pedestal having side surfaces 55 and top surfaces 56, on the first surface 51 of the transparent substrate 10. As described in the previous paragraph the side surfaces 55 of the photoresist pedestals 15 are not perpendicular to the first surface 51 of the transparent substrate 10 but increasingly extend over the attenuating phase shifting material 12 as the distance above the first surface 51 of the transparent substrate 10 increases. This slope of the side surfaces 55 of the photoresist pedestals 15 forms rims 20 on the patterned layer of attenuating phase shifting material 12 which is directly below photoresist material in the photoresist pedestals 15.

Figure 4:
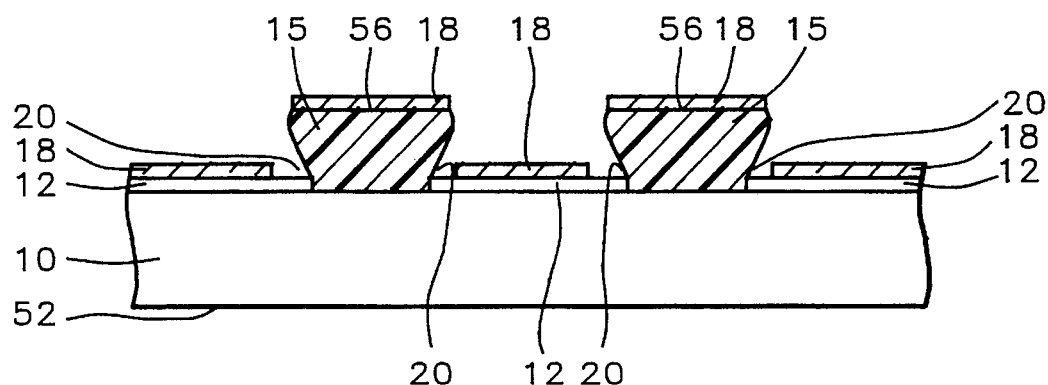
FIG. 4 shows a cross section view of the photomask after opaque material has been vertically anisotropically deposited on the photoresist pedestals and the patterned layer of attenuating phase shifting material.

Next, as shown in FIG. 4, a layer of opaque material 18 is vertically anisotropically deposited on top surfaces 56 of the photoresist pedestals and those regions of the attenuating phase shifting material 12 which are not directly below photoresist material in the photoresist pedestals 15. There will be no opaque material formed on the rims 20 on the patterned layer of attenuating phase shifting material 12 which are directly below photoresist material in the photoresist pedestals 15, since the photoresist material blocks the opaque material from being deposited on the rims 20 during vertical anisotropic deposition. The opaque material 18 is chrome having a thickness of between about 500 and 1500 Angstroms and is deposited using collimated sputtering of chrome.

Figure 5:
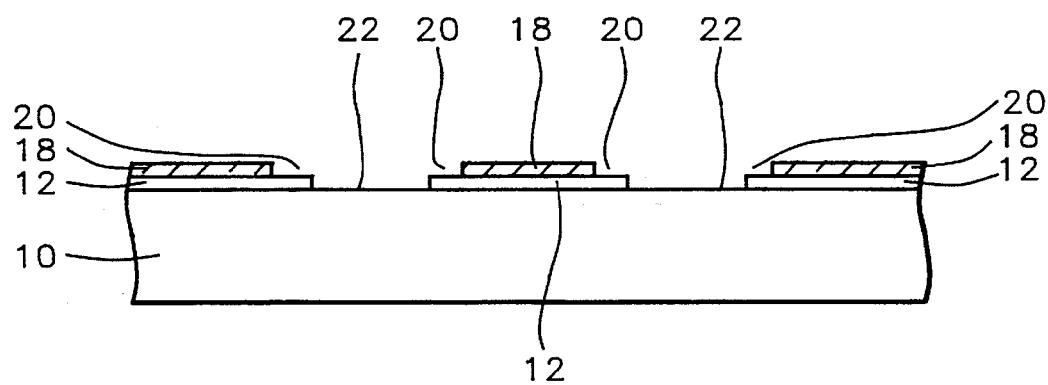
FIG. 5 shows a cross section view of the completed rim type attenuating phase shifting mask.

Next, as shown in FIG. 5, the photoresist pedestals are removed which also removes that part of the opaque material formed on the top surface of the photoresist pedestals.

The photomask is then completed having regions 22 of neither attenuating phase shifting material 12 nor opaque material 18, regions of attenuating phase shifting material only 20, and regions of both attenuating phase shifting material 12 and opaque material 18 formed on the transparent substrate 10. The regions of attenuating phase shifting material only 20 form rims of attenuating phase shifting material around the regions 22 having neither attenuating phase shifting material nor opaque material, thereby forming an attenuating phase shifting rim type photomask. The attenuating phase shifting rim is self aligned to the rest of the mask. There are no alignment steps required after the patterned layer of attenuating phase shifting material is formed.

Figure 6:
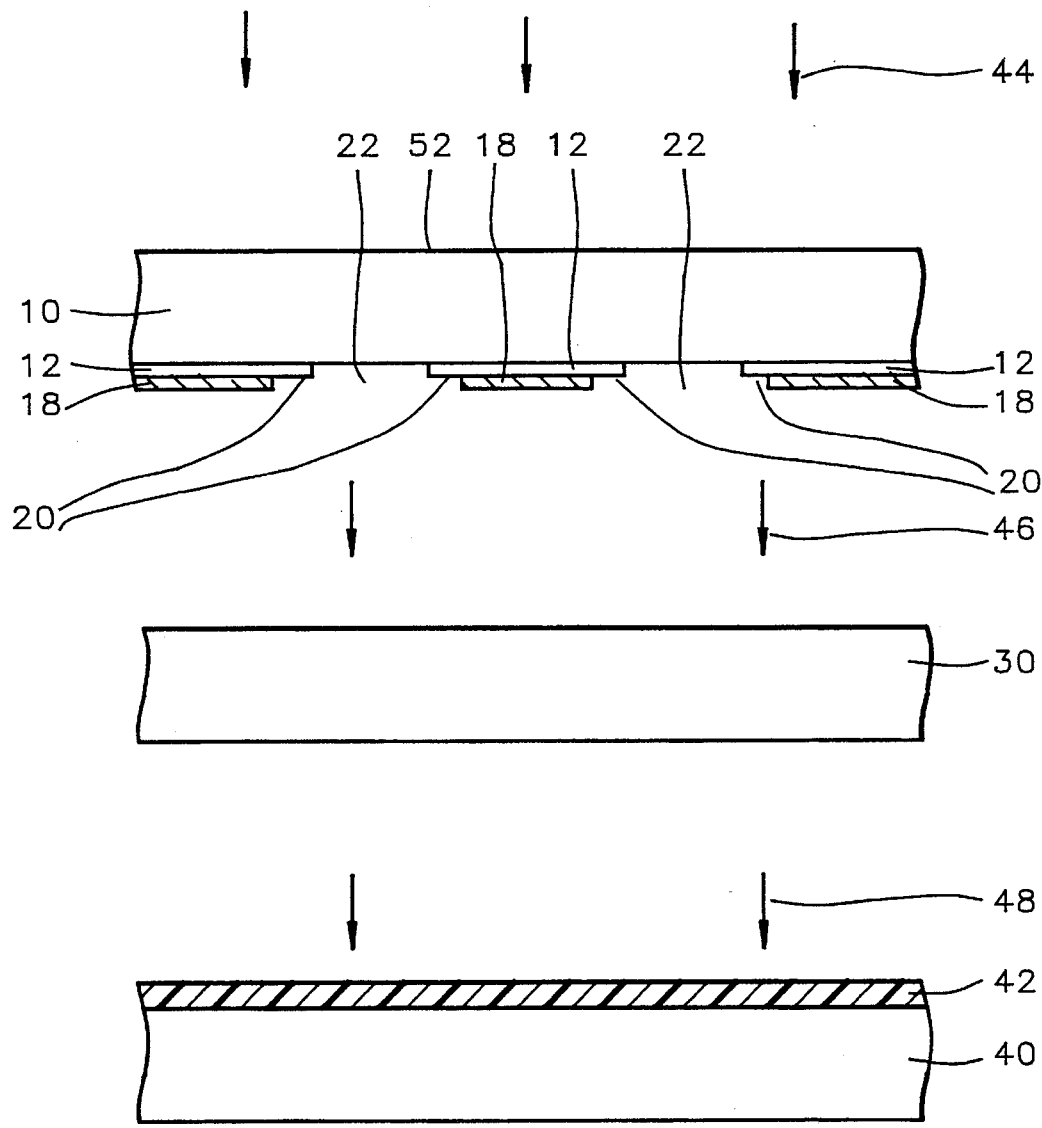
FIG. 6 shows a block diagram of the rim type attenuating phase shifting mask used in a projection lithography apparatus to form an image on a layer of photoresist on a semiconductor substrate.

Refer now to FIG. 6, there is shown an embodiment of the attenuating phase shifting rim type photomask of this invention used in a projection apparatus, such as a five times reduction stepper, for forming an image on a photoresist layer formed on a semiconductor substrate. The photomask comprises a patterned layer of attenuating phase shifting material 12 formed on a first surface of a transparent mask substrate 10. The transparent mask substrate 10 is a material such as quartz having a thickness of between about 0.090 and 0.250 inches. The patterned layer of attenuating phase shifting material 12 is formed of a material such as MoSiO having a thickness of between about 50 and 300 nanometers. A layer of opaque material 18, such as chrome having a thickness of between about 500 and 1500 Angstroms, is formed on the patterned layer of attenuating phase shifting material 12 so as to leave a rim 20 at the pattern edge of the patterned layer of attenuating phase shifting material 12. The formation of the photomask and especially the opaque layer 18 is described in the previous embodiment.

A beam of light 44 is directed to the second surface 52 of the transparent mask substrate 10. The light 46 emerging from the photomask is directed to a focussing lens 30. Light 48 emerging from the focussing lens is focussed on a layer of photoresist 42 formed on a semiconductor substrate 40.

The light 46 directed to the second surface 52 of the transparent mask substrate 10 passes through regions of no phase shifting nor attenuating material 20, passes through a rim 20 of attenuating phase shifting material 12, or is blocked by the opaque material 18. The light 46 in the beam emerging from the photomask near the rim 20 of attenuating phase shifting material 12 has light with no phase shift nor attenuation adjacent to light having both attenuation and phase shift thereby causing an interference pattern. This interference pattern provides improved image definition and depth of focus for the image formed on the layer of photoresist 42 formed on the semiconductor substrate 40.

While the invention has been particularly shown and described with reference to the preferred embodiments thereof, it will be understood by those skilled in the art that various changes in form and details may be made without departing from the spirit and scope of the invention.

What is claimed is:

1. A method of forming a rim phase shifting photomask mask, comprising the steps of:

providing a transparent mask substrate having a first surface and a second surface;

forming a patterned layer of attenuating phase shifting material on said first surface of said transparent mask substrate;

forming a layer of negative photoresist on said first surface of said transparent mask substrate covering said patterned layer of attenuating phase shifting material;

illuminating said second surface of said transparent mask substrate with light from a floodlight source having an intensity wherein that part of said layer of negative photoresist illuminated by light which does not pass through said patterned layer of attenuating phase shifting material is exposed and the remainder of said layer of negative photoresist is not exposed, whereby the boundary between said exposed and said not exposed regions of said negative photoresist is not perpendicular to said first surface of said transparent substrate but increasingly extends over said attenuating phase shifting material as said distance above said first surface of said transparent substrate developing said layer of negative photoresist thereby forming photoresist pedestals by leaving only those parts of said layer of negative photoresist exposed by said light;

vertically anisotropically depositing a layer of opaque material on said photoresist pedestals and those parts of said patterned layer of attenuating phase shifting material not shielded by said photoresist pedestal thereby forming a rim of said patterned layer of attenuating phase shifting material which is not covered by said layer of opaque material; and removing said photoresist pedestals and said layer of opaque material formed on said photoresist pedestals thereby forming said rim phase shifting photomask.

2. The method of claim 1 wherein said transparent mask substrate is quartz having a thickness of between about 0.090 and 0.250 inches.

3. The method of claim 1 wherein said layer of opaque material is chrome having a thickness of between about 500 and 1500 Angstroms.

4. The method of claim 3 wherein said layer of opaque material is formed by means of collimated sputtering.

5. The method of claim 1 wherein said light has a wavelength between about 150 and 300 nanometers.

6. The method of claim 1 wherein said layer of negative photoresist has a thickness of between about 0.5 and 3 micrometers.

7. The method of claim 1 wherein said patterned layer of attenuating phase shifting material is MoSiO.

8. The method of claim 1 wherein said patterned layer of attenuating phase shifting material has a thickness of between about 50 and 300 nanometers.

9. The method of claim 1 wherein said patterned layer of attenuating phase shifting material is formed by means of sputtering.

10. A rim phase shifting photomask mask, comprising:

a transparent mask substrate having a first surface and a second surface;

a patterned layer of attenuating phase shifting material, wherein said patterned layer of attenuating phase shifting material comprises an interior pattern region and a rim, formed on said first surface of said transparent mask substrate; and a layer of opaque material formed on said interior pattern region of said patterned layer of attenuating phase shifting material by means of forming a layer of negative photoresist on said first surface of said transparent mask substrate covering said patterned layer of attenuating phase shifting material; illuminating said second surface of said transparent mask substrate with light from a floodlight source having an intensity wherein that part of said layer of negative photoresist illuminated by light which does not pass through said patterned layer of attenuating phase shifting material is exposed and the remainder of said layer of negative photoresist is not exposed, whereby the boundary between said exposed and said not exposed regions of said negative photoresist is not perpendicular to said first surface of said transparent substrate but increasingly extends over said attenuating phase shifting material as said distance above said first surface of said transparent substrate increases; developing said layer of negative photoresist thereby forming photoresist pedestals by leaving only those parts of said layer of negative photoresist exposed by said light; vertically anisotropically depositing said layer of opaque material on said photoresist pedestals and those parts of said patterned layer of attenuating phase shifting material not shielded by said photoresist pedestal thereby forming said rim of said patterned layer of attenuating phase shifting material which is not covered by said layer of opaque material; and removing said photoresist pedestals and said layer of opaque material formed on said photoresist pedestals.

11. The rim phase shifting photomask of claim 10 wherein said transparent mask substrate is quartz having a thickness of between about 0.090 and 0.250 inches.

12. The rim phase shifting photomask of claim 10 wherein said layer of opaque material is chrome having a thickness of between about 500 and 1500 Angstroms.

13. The rim phase shifting photomask of claim 10 wherein said layer of opaque material is formed by means of collimated sputtering.

14. The rim phase shifting photomask of claim 10 wherein said patterned layer of attenuating phase shifting material is MoSiO.

15. The rim phase shifting photomask of claim 10 wherein said patterned layer of attenuating phase shifting material has a thickness of between about 50 and 300 nanometers.

16. The rim phase shifting photomask of claim 10 wherein said patterned layer of attenuating phase shifting material is formed by means of sputtering.

17. The rim phase shifting photomask of claim 10 wherein said light has a wavelength between about 150 and 300 micrometers.

18. The rim phase shifting photomask of claim 10 wherein said layer of negative photoresist has a thickness of between about 0.5 and 3 micrometers.

* * * * *